United States Patent
Hashimoto et al.

(10) Patent No.: US 9,699,890 B2
(45) Date of Patent: Jul. 4, 2017

(54) ELECTRONIC BOARD UNIT

(71) Applicant: Mitsubishi Electric Corporation, Tokyo (JP)

(72) Inventors: Koji Hashimoto, Tokyo (JP); Keiichi Arita, Tokyo (JP); Shozo Kanzaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 155 days.

(21) Appl. No.: 14/823,265

(22) Filed: Aug. 11, 2015

(65) Prior Publication Data

US 2016/0205771 A1 Jul. 14, 2016

(30) Foreign Application Priority Data

Jan. 9, 2015 (JP) .................................. 2015-002803

(51) Int. Cl.
| | |
|---|---|
| *H05K 1/02* | (2006.01) |
| *H05K 1/09* | (2006.01) |
| *H05K 3/28* | (2006.01) |
| *H05K 1/18* | (2006.01) |

(52) U.S. Cl.
CPC ......... *H05K 1/0266* (2013.01); *H05K 1/0269* (2013.01); *H05K 1/09* (2013.01); *H05K 1/181* (2013.01); *H05K 3/284* (2013.01); *H05K 2201/0108* (2013.01); *H05K 2201/10545* (2013.01); *H05K 2203/176* (2013.01)

(58) Field of Classification Search
CPC ...... H05K 1/0266; H05K 1/0269; H05K 1/09; H05K 3/284; H05K 2203/176; H05K 2201/0108; H05K 2201/10545; H05K 1/181
See application file for complete search history.

(56) References Cited

U.S. PATENT DOCUMENTS 6,124,014 A * 9/2000 Nagatsuna .............. B29B 17/00
428/187
6,705,509 B2 * 3/2004 Tada ...................... B23K 1/018
228/119

(Continued)

FOREIGN PATENT DOCUMENTS

| JP | 2009-021486 A | 1/2009 |
| JP | 2011148364 A * | 8/2011 |

*Primary Examiner* — Nathan Milakovich
(74) *Attorney, Agent, or Firm* — Sughrue Mion, PLLC; Richard C. Turner

(57) ABSTRACT

Second display means front parts, each including an immersion liquid surface level display for a coating liquid for moisture prevention and a lead-free display mark, are formed respectively in upper portions on a left side and a right side that are opposite sides having the one side interposed therebetween. A first display means front part including a board management document number, which defines a material for solder, is formed in a lower portion of the printed circuit board. A lead-free display mark (PBF) is not buried in or mixed with a large number of circuit information displays in the board, and a detailed management number is described in a reduced size to conserve space. Thus, the important lead-free display mark can be displayed with large character marks that also serve to manage a liquid surface.

16 Claims, 6 Drawing Sheets

(56) References Cited

U.S. PATENT DOCUMENTS

| | | | | |
|---|---|---|---|---|
| 7,251,880 B2* | 8/2007 | Pearson | ............... | H05K 1/0266 228/180.1 |
| 7,540,078 B1* | 6/2009 | Suetsugu | ............. | H05K 1/0266 29/426.3 |
| 7,891,068 B2* | 2/2011 | Takagi | ...................... | B09B 5/00 29/403.1 |
| 8,649,896 B2* | 2/2014 | Yokosawa | ......... | H01L 21/67294 700/116 |

* cited by examiner

FIRST DISPLAY EXAMPLE

SECOND DISPLAY EXAMPLE

FIRST DISPLAY EXAMPLE

SECOND DISPLAY EXAMPLE

ELECTRONIC BOARD UNIT

BACKGROUND OF THE INVENTION

1. Field of the Invention

The present invention relates to an improvement of identification mark display means in an electronic board unit in which a leaded/lead-free identification mark, which indicates whether or not the lead content of applied solder is less than a predetermined value, is displayed on a printed circuit board having a circuit component soldered thereon.

2. Description of the Related Art

In order to enhance recycle efficiency in an electronic circuit board having an electronic circuit component mounted and soldered thereon, it has been identified and displayed whether applied solder is a leaded material or a lead-free material.

For example, in Japanese Patent Application Laid-open No. 2009-021486, there is disclosed the kind and shape of an identification mark for visually determining whether each solder on a front surface or aback surface of an electronic circuit board, which includes both reflow solder and flow solder, is lead-free or leaded. On a first surface 10a of an electronic circuit board 10 of FIG. 1 of Japanese Patent Application Laid-open No. 2009-021486, a first identification mark 20c for the reflow solder and a second identification mark 30c for the flow solder are formed, and similarly on a second surface 10b thereof, a first identification mark 20s for the reflow solder and a second identification mark 30s for the flow solder are formed.

The respective identification marks include core portions 25 and 35 having different shapes depending on the difference between the reflow solder and the flow solder and shell portions 21 to 24 and 31 to 34 for expressing the difference in detailed specifications.

Further, the respective identification marks are designed so that solder resist films 26 and 36 are opened to expose an underlying circuit pattern and an outer appearance is changed by applying or not applying a solder paste to the circuit pattern.

(1) Description of Problem of the Related Art

The above-mentioned "electronic circuit board" of Japanese Patent Application Laid-open No. 2009-021486 has a feature of being capable of performing a display in accordance with a plurality of soldering standards such as an electronic circuit board including an electrode terminal subjected to pre-coating by solder plating (HAL board) and an electronic circuit board including an electrode terminal not subjected to pre-coating (HAL-less board).

In recent years, although high-temperature lead solder for mounting of a semiconductor chip in an electronic component is exempted from regulations due to the lack of appropriate alternative means, the movement for eliminating lead from solder is, in the other cases, spreading equally irrespective of flow solder or reflow solder, and a lead content rate at an ability level is 0.05 mass %, which is less than an official regulation value of 0.1 mass %.

Along with this, in order to distinguish future products from the past products, it is sufficient that lead-free display means, which declares that the lead content rate is less than the official regulation value, be formed, and a complicated identification mark may have a problem of causing confusion.

Further, while a display space is becoming narrow along with the advancement of high-density mounting of a circuit board, various kinds of design information and operation information, as well as lead-free information, are desired to be displayed. Thus, there is a demand for display means that is not buried in those various kinds of display information.

SUMMARY OF THE INVENTION

(2) Description of Objects of the Invention

It is a first object of the present invention to provide means for displaying a lead-free display mark that is large and easy to understand in an easy-to-see place without causing the lead-free display mark to be buried in various circuit information displays.

It is a second object of the present invention to display a document number that defines a content of the lead-free display mark in a related region so that detailed information can be retrieved.

According to one embodiment of the present invention, there is provided an electronic board unit, including:

a printed circuit board having a connector mounted on one side thereof, the printed circuit board including, on one of a front surface and a back surface thereof, one of front circuit components and back circuit components, which are all soldered onto the printed circuit board through lead-free solder having a low lead content rate;

first display means formed along one of an opposite side parallel to the one side of the printed circuit board and at least one of opposite sides orthogonal to the one side of the printed circuit board; and a pair of second display means formed respectively along a left side and a right side that are the opposite sides orthogonal to the one side of the printed circuit board, the first display means serving as design information display means for displaying, with characters, a board management document number that defines at least a material for applied solder through use of a solder resist film applied to one of the front surface and the back surface of the printed circuit board, the pair of second display means displaying a lead-free display mark that indicates at least that a lead content of the applied solder is less than a predetermined value through use of a solder resist film applied to one of the front surface and the back surface of the printed circuit board, the lead-free display mark being positioned close to a position at which the connector is mounted and also serving as operation information display means that includes an upper limit position display and a lower limit position display, which indicate an appropriate amount level range of a coating liquid for moisture prevention when the printed circuit board is immersed in a hot-dipping bath so that the coating liquid for moisture prevention is applied to the printed circuit board.

As described above, the electronic board unit according to the one embodiment of the present invention includes the printed circuit board having the connector and the circuit component mounted thereon, and the coating liquid for moisture prevention is to be applied to a surface of the printed circuit board excluding the connector portion in the hot-dipping bath. The operation information display means for displaying the appropriate amount level of the coating liquid includes the lead-free display mark indicating that the lead content of the applied solder is less than the predetermined value. At a position different from the display position of the operation information display means, the board management document number that defines the material for the applied solder, which serves as the design information display means, is displayed.

Thus, there is the following effect. In the high-density mounting printed circuit board having a narrow display space, the liquid amount level and the lead-free display mark are displayed in the same region as the operation information display means, and the display space is effectively used so that large and easy-to-see characters and marks can be displayed.

Further, there is the following effect. Even when a large amount of circuit information, such as the position of a first pin of an integrated circuit element, the position of a source terminal or an emitter terminal of a transistor, the polarity of a diode or a capacitor, and the like, are displayed on the surface of the printed circuit board, the lead-free display mark is displayed in a different region of the surface of the printed circuit board so as not to be buried in those various kinds of display information and hence can be visually recognized easily.

Still further, there is the following effect. The board management document number containing a large amount of information is separated from the lead-free display mark and can be described in a reduced size as detailed information, and hence the display space is easily ensured. In addition, both of the board management document number and the lead-free display mark are arranged in peripheral portions of the printed circuit board, and hence the board management document number and the lead-free display mark can be visually recognized easily as interrelated information.

DETAILED DESCRIPTION OF THE PREFERRED EMBODIMENTS

First Embodiment (1) Detailed Description of Configuration

First, a configuration is described with reference to FIG. 1 that is a front view of an electronic board unit according to a first embodiment of the present invention and FIG. 2 that is a back view thereof.

Figure 1:
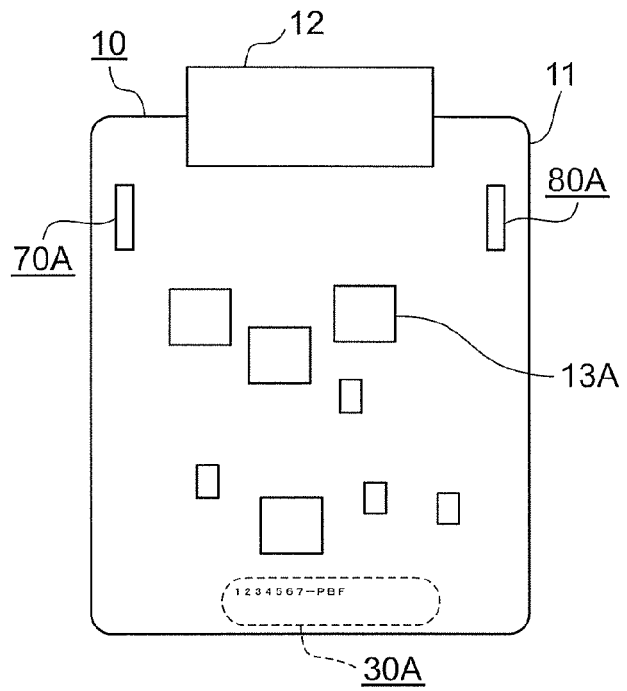
FIG. 1 is a front view of an electronic board unit according to a first embodiment of the present invention.
Figure 2:
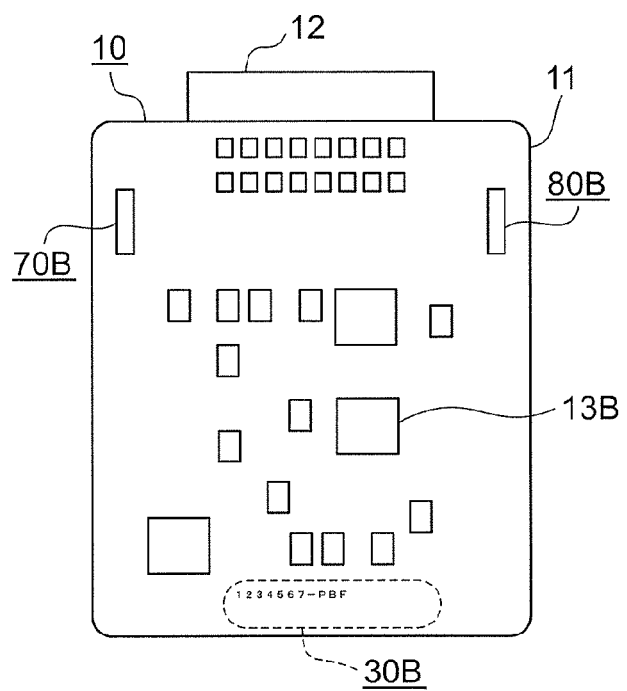
FIG. 2 is a back view of the electronic board unit according to the first embodiment of the present invention.

In FIGS. 1 and 2, a connector 12 is mounted on a printed circuit board 11 serving as a main component of an electronic board unit 10, and the printed circuit board 11 includes one or both of a plurality of front circuit components 13A mounted on a front surface of the printed circuit board 11 and a plurality of back circuit components 13B mounted on a back surface of the printed circuit board 11.

Note that, although the connector 12 illustrated in FIGS. 1 and 2 is designed so that one end of a right angle contact terminal is to be press-fitted and fixed to a connector housing and the other end thereof is soldered onto the back surface of the printed circuit board 11 through a through-hole plated hole formed in the printed circuit board 11, the connector 12 may be designed instead so that an electrode terminal of a copper foil pattern is formed on one side of the printed circuit board 11 and a card edge connector (not shown) is mounted on the electrode terminal.

Figure 3:
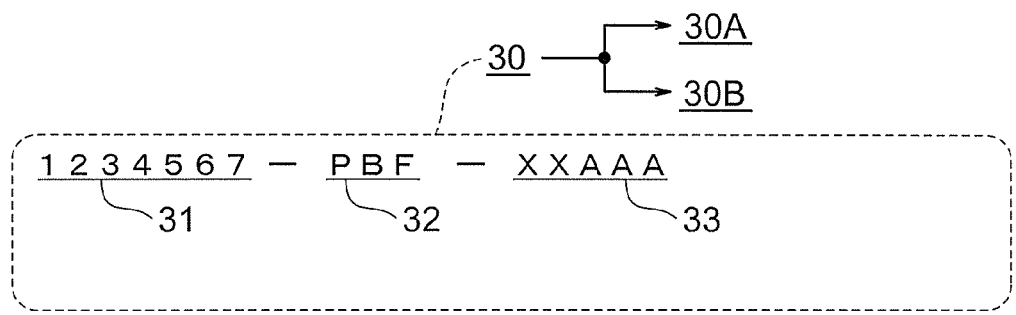
FIG. 3 is a detailed view of first display means according to the first embodiment of the present invention.

At least one of a first display means front part 30A or a first display means back part 30B, which serves as first display means 30 described later with reference to FIG. 3, is formed on the front and back surfaces of the printed circuit board 11 at an opposite side position parallel to the one side on which the connector 12 is mounted.

Figure 7:
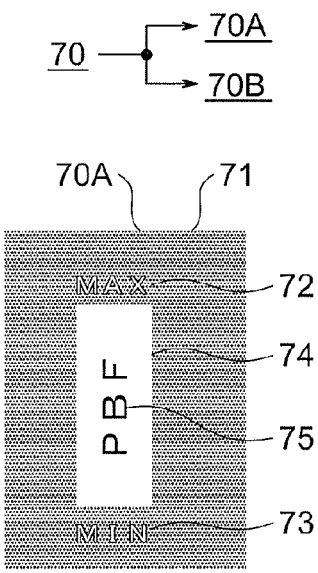
FIG. 7 is a first display example of second display means according to the first embodiment of the present invention.
Figure 8:
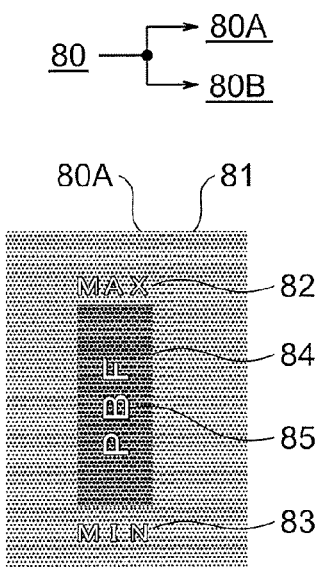
FIG. 8 is a second display example of the second display means according to the first embodiment of the present invention.

Second display means 70 on a left side and second display means 80 on a right side described later with reference to FIGS. 7 and 8 are formed at left and right opposite side positions orthogonal to the one side on which the connector 12 is mounted. The second display means 70 includes at least one of a second display means front part 70A or a second display means back part 70B on the front and back surfaces of the printed circuit board 11, and the second display means 80 includes at least one of a second display means front part 80A or a second display means back part 80B on the front and back surfaces of the printed circuit board 11.

Note that, on the front surface of the printed circuit board 11, at least one of the first display means (first display means front part 30A) and the second display means (second display means front parts 70A and 80A) is formed, and on the back surface of the printed circuit board 11, at least the other of the first display means (first display means back part 30B) and the second display means (second display means back parts 70B and 80B) is formed.

Note that, it is not necessarily required to use the second display means 70 and the second display means 80, which differ in display method, in combination, and it is sufficient that the second display means front part 70A be formed on the left side and the right side of the front surface of the printed circuit board 11 and the second display means back part 70B be formed on the left side and the right side of the back surface of the printed circuit board 11, or that the second display means front part 80A be formed on the left side and the right side of the front surface of the printed circuit board 11 and the second display means back part 80B be formed on the left side and the right side of the back surface of the printed circuit board 11.

In FIG. 3 that is a detailed view of the first display means 30 representing the first display means front part 30A or the first display means back part 30B of FIGS. 1 and 2, a board management document number 31 is a product specification number or a drawing number including at least information on a material for solder applied in the electronic board unit 10.

A collaborative display mark 32 following the board management document number 31 is the same mark as lead-free display marks 75 and 85 described later with reference to FIGS. 7 and 8. The collaborative display mark 32 suggests that the board management document number 31 in the first display means 30 relates to the lead-free display marks 75 and 85 in the second display means 70 and 80.

A trace number 33 following the collaborative display mark 32 is a history information identification number such as a manufacturing date or a manufacturing lot number of the electronic board unit 10. The trace number 33 is applicable in the case where soldering of the electronic board unit 10 is performed through use of the printed circuit board 11, which has already been stocked, with a document number different from the board management document number 31 described on the stocked printed circuit board 11. The trace number 33 is formed by temporarily adding a character mark by stamping or laser processing.

Figure 4:
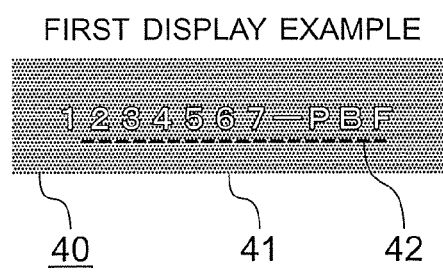
FIG. 4 is a first display example of the first display means according to the first embodiment of the present invention.

In FIG. 4 illustrating a first display example 40 of the first display means 30 of FIGS. 1 and 2, a solder resist film 41 is formed so as to prevent the adhesion of the solder in a later step, for example, by curing a thermosetting epoxy resin applied to the surface of the printed circuit board 11 with UV-rays. In a previous step, a circuit pattern is formed by etching on a copper foil bonded to the printed circuit board 11, and the solder resist film 41 in a region not irradiated with UV-rays is removed by washing. A solder paste is applied to this region to perform reflow soldering or molten solder is caused to adhere to this region by flow soldering.

Note that, in the case where the underlying portion of the solder resist film 41 is a surface of a base material for the printed circuit board 11 instead of the copper foil, a character mark 42 is formed by white blank sections (surface of the base material from which the solder resist film 41 has been removed) corresponding to shapes of openings of the solder resist film 41. Thus, the board management document number 31 and the collaborative display mark 32 of FIG. 3 are displayed.

Figure 5:
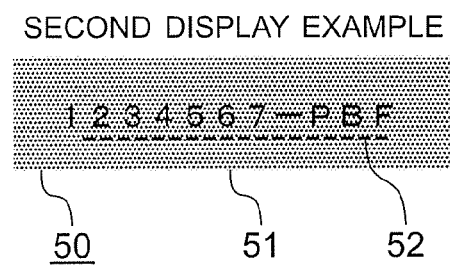
FIG. 5 is a second display example of the first display means according to the first embodiment of the present invention.

In FIG. 5 illustrating a second display example 50 of the first display means 30 of FIGS. 1 and 2, a solder resist film 51 is formed, for example, by applying a thermosetting epoxy resin to the surface of the copper foil on the printed circuit board 11, and a character mark 52 is formed by black blank sections (surface of the copper foil from which the solder resist film 51 has been removed) corresponding to shapes of openings of the solder resist film 51. Thus, the board management document number 31 and the collaborative display mark 32 of FIG. 3 are displayed.

Note that, the surface of the base material for the printed circuit board 11 has white color or yellow color, and the surface of the copper foil has brown color or gray color when the solder is applied to the copper foil, whereas the solder resist film has semi-transparent green color. Due to the difference in color tone, the board management document number 31 and the collaborative display mark 32 are displayed clearly.

Figure 6:
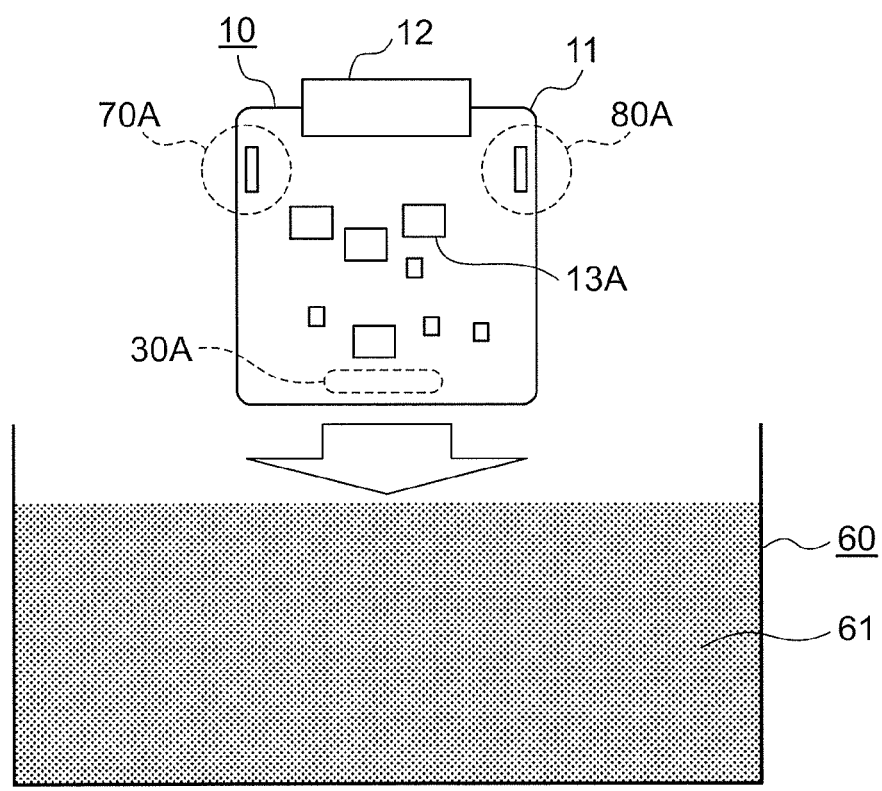
FIG. 6 is a schematic configuration view of a coating treatment device for the electronic board unit according to the present invention.

In FIG. 6 that is a schematic configuration view of a coating treatment device for the electronic board unit according to the present invention, the electronic board unit 10 is immersed in a hot-dipping bath 60 with the connector 12 positioned on the upper side, and the hot-dipping bath 60 is filled with, for example, a transparent coating liquid 61 of a silicone resin.

The second display means front part 70A formed in an upper left side portion of the printed circuit board 11 and the second display means back part 70B described above with reference to FIG. 2 form the second display means 70 on the left side, and the detail thereof is described later with reference to FIG. 7.

The second display means front part 80A formed in an upper right side portion of the printed circuit board 11 and the second display means back part 80B described above with reference to FIG. 2 form the second display means 80 on the right side, and the detail thereof is described later with reference to FIG. 8.

Note that, a pair of the second display means 70 and 80 on the left side and the right side serves as operation information display means for monitoring the liquid surface level of the coating liquid 61 when the electronic board unit 10 is immersed in the hot-dipping bath 60. In this case, the pair of the second display means 70 and 80 also displays a lead-free display mark PBF.

In FIG. 7 illustrating the detail of the second display means front part 70A as a first display example of the second display means of FIGS. 1 and 2, a solder resist film 71 is formed by applying the above-mentioned thermosetting epoxy resin to the surface of the base material for the printed circuit board 11. A liquid surface monitoring region 74, as well as character marks MAX and MIN of an upper limit position display 72 and a lower limit position display 73, are formed by white blank sections (surface of the base material from which the solder resist film 71 has been removed) corresponding to shapes of openings of the solder resist film 71.

In the liquid surface monitoring region 74 in which the surface of the base material can be directly monitored, the lead-free display mark 75 is displayed with a copper foil as a character mark PBF, and a portion other than the character mark PBF in the liquid surface monitoring region 74 is a region from which the copper foil has been removed by etching.

In FIG. 8 illustrating the detail of the second display means front part 80A as a second display example of the second display means of FIGS. 1 and 2, a solder resist film 81 is formed by applying the above-mentioned thermosetting epoxy resin to the surface of the copper foil on the printed circuit board 11. Character marks MAX and MIN of an upper limit position display 82 and a lower limit position display 83 are formed by black blank sections (surface of the copper foil from which the solder resist film 81 has been removed) corresponding to shapes of openings of the solder resist film 81.

Note that, the solder resist film 81 is applied to a liquid surface monitoring region 84, and the surface of the copper foil serving as an underlying portion of the liquid surface monitoring region 84 is seen through the semi-transparent solder resist film 81.

Further, in the liquid surface monitoring region 84 in which the surface of the copper foil can be seen through, the lead-free display mark 85 is displayed in a white blank as a character mark PBF by etching, and the solder resist film 81 is not applied to the lead-free display mark 85.

(2) Main Points and Features of First Embodiment

As is apparent from the foregoing, the electronic board unit 10 according to the first embodiment of the present invention includes the printed circuit board 11 having the connector 12 mounted on one side thereof. The printed circuit board 11 includes, on the front surface or the back surface thereof, the front circuit components 13A or the back circuit components 13B, which are all soldered onto the printed circuit board 11 through lead-free solder having a low lead content rate.

The electronic board unit 10 includes the first display means 30 formed along an opposite side parallel to the one side of the printed circuit board 11, and the pair of the second display means 70 or the second display means 80 formed respectively along a left side and a right side that are opposite sides orthogonal to the one side of the printed circuit board 11.

The first display means 30 serves as design information display means for displaying, with characters, the board management document number 31 that defines at least a material for the applied solder through use of a solder resist film applied to the front surface or the back surface of the printed circuit board 11.

The second display means 70 and 80 displays the lead-free display marks 75 and 85 that indicates at least that a lead content of the applied solder is less than a predetermined value through use of a solder resist film applied to the front surface or the back surface of the printed circuit board 11.

The lead-free display marks 75 and 85 are positioned close to a position at which the connector 12 is mounted and also serves as the operation information display means that includes the upper limit position display 72 and 82 and the lower limit position display 73 and 83, which indicate an appropriate amount level range of the coating liquid 61 for moisture prevention when the printed circuit board 11 is immersed in the hot-dipping bath 60 so that the coating liquid 61 for moisture prevention is applied to the printed circuit board 11.

The board management document number 31 and 91, the lead-free display marks 75 and 85, the upper limit position display 72 and 82, and the lower limit position display 73 and 83 are drawn the surface of the base material for the printed circuit board 11 or the surface of the copper foil bonded to the base material, which is exposed from an opening of the solder resist film 41, 51, 71, and 81 applied so as to prevent adhesion of the solder to the surface of the copper foil on the printed circuit board 11.

The coating liquid 61 is transparent, and the solder resist film 41, 51, 71, and 81 has a color tone different from a color tone of any one of the base material for the printed circuit board 11, the copper foil, and the solder.

As described above, according to claim 2 of the present invention, the character mark to be displayed on the surface of the printed circuit board 11 is drawn on the surface of the base material for the printed circuit board 11 or the surface of the copper foil, having a color tone different from that of the solder resist film, and the shape of the drawn character mark is determined by the shape of the opening of the solder resist film.

Accordingly, the first embodiment has a feature in that a display can be performed with a character mark easily at a time of the formation of the solder resist film irrespective of display means such as silkscreen printing, stamping, or laser processing.

Further, in the first display means and the second display means, the underlying portion of the solder resist film may be the copper foil pattern or the base material for the printed circuit board. Therefore, the first embodiment has a feature in that there is no constraint on a pattern configuration in a peripheral portion of the printed circuit board, and a convenient display place can be selected.

The same also applies to the second embodiment.

The first display means 30 and 90 further includes, in addition to the board management document number 31 and 91, the collaborative display mark 32 and 92 that includes a content equivalent to the lead-free display marks 75 and 85 described in the second display means 70 and 80.

As described above, according to claim 3 of the present invention, in the first display means, the lead-free display mark described in the second display means is displayed in a collaborative manner in addition to the board management document number.

Accordingly, the first embodiment has a feature in that it becomes clear that a content of the first display means relates to the lead-free display mark described in a large size in the second display means.

The same also applies to the second embodiment.

The first display means 30 further includes the trace number 33.

The trace number 33 is a history information identification number typified by the manufacturing date of the electronic board unit 10 or the manufacturing lot number of the electronic board unit 10. When an electronic board unit is manufactured with a new board management document number by changing at least a content of the board management document number 31 described on the printed circuit board 11 that has been stocked, the trace number 33 serves as additional information for identifying the new board management document number, and the trace number 33 is drawn by stamping or laser processing.

As described above, according to claim 4 of the present invention, the first display means includes the trace number information in addition to the board management document number.

Accordingly, the first embodiment has a feature in that, in the case where the board management document number is changed, and an electronic board unit can be manufactured with a new management content through use of the printed circuit board that has been stocked, the trace number information can be used effectively.

Description is made of a case where the printed circuit board 11 is subjected to soldering on both surfaces of the printed circuit board 11.

The first display means 30 and 90 is formed on both surfaces of the printed circuit board 11 as the first display means front part 30A and 90A and the first display means back part 30B and 90B or formed on at least one of the front surface and the back surface.

The second display means 70 and 80 is formed on both the surfaces as the second display means front part 70A and 80A and the second display means back part 70B and 80B or formed on at least the other of the front surface and the back surface.

As described above, according to claim 6 of the present invention, the second display means formed on at least one surface of the printed circuit board perform a display on the left side and the right side, and at least the first display means performs a display on the other surface.

Accordingly, the first embodiment has a feature in that the presence/absence of the lead-free display can be visually recognized from any surface of the printed circuit board, and hence it does not take time and labor for reading in the case where the printed circuit boards are stacked or in the case where the printed circuit board is accommodated in a housing.

The same also applies to the second embodiment.

Second Embodiment (1) Detailed Description of Configuration

Now, a configuration is described in detail with reference to FIG. 9 that is a front view of an electronic board unit according to a second embodiment of the present invention and FIG. 10 that is a back view thereof, mainly focusing on differences from FIGS. 1 and 2.

Note that, the main differences from FIGS. 1 and 2 reside in the setting position of the first display means and a part of the content thereof. In each of FIGS. 9 and 10, like reference symbols denote like or corresponding components.

Figure 9:
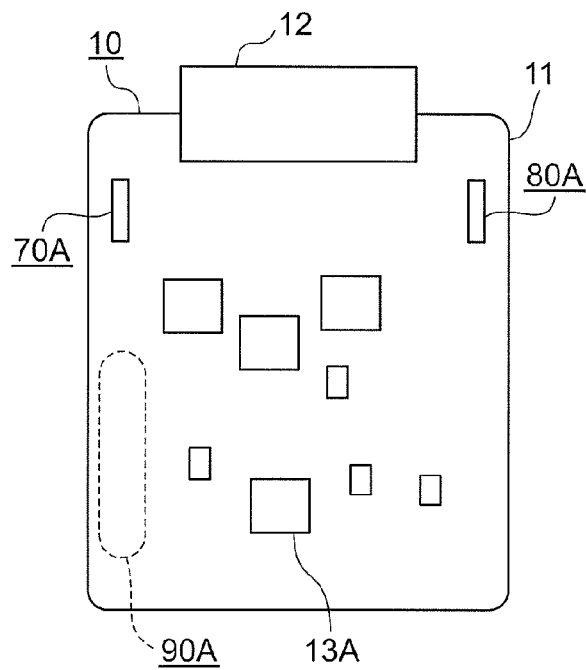
FIG. 9 is a front view of an electronic board unit according to a second embodiment of the present invention.
Figure 10:
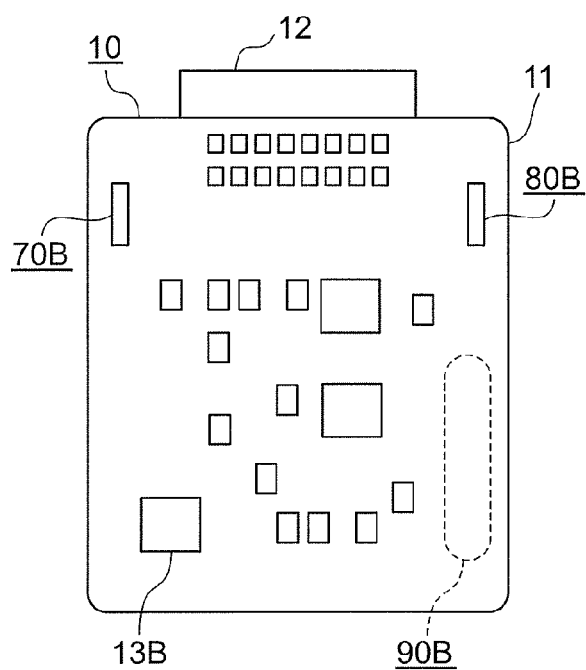
FIG. 10 is a back view of the electronic board unit according to the second embodiment of the present invention.

In FIGS. 9 and 10, the connector 12 is mounted on the printed circuit board 11 serving as a main component of the electronic board unit 10 in the same way as in FIGS. 1 and 2, and the printed circuit board 11 includes one or both of the plurality of front circuit components 13A mounted on the front surface of the printed circuit board 11 and the plurality of back circuit components 13B mounted on the back surface of the printed circuit board 11.

Figure 11:
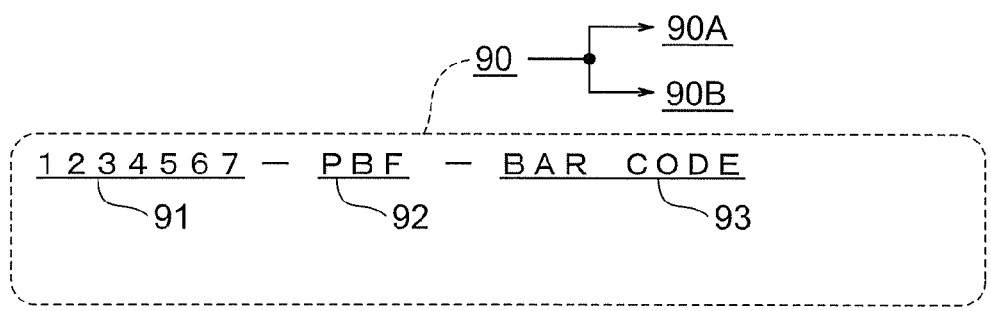
FIG. 11 is a detailed view of first display means according to the second embodiment of the present invention.

At least one of a first display means front part 90A or a first display means back part 90B, which serves as first display means 90 described later with reference to FIG. 11, is formed on the front or back surface of the printed circuit board 11 at a position on the front left side or the back right side, which is orthogonal to the one side on which the connector 12 is mounted.

The second display means 70 on the left side and the second display means 80 on the right side described above with reference to FIGS. 7 and 8 are formed at left and right opposite side positions orthogonal to the one side on which the connector 12 is mounted. The second display means 70 includes at least one of the second display means front part 70A or the second display means back part 70B on the front and back surfaces of the printed circuit board 11, and the second display means 80 includes at least one of the second display means front part 80A or the second display means back part 80B on the front and back surfaces of the printed circuit board 11.

In FIG. 11, which is a detailed view of the first display means 90 representing the first display means front part 90A or the first display means back part 90B of FIGS. 9 and 10, a board management document number 91 is a product specification number or a drawing number including at least information on a material for solder applied in the electronic board unit 10 similarly to the board management document number 31 in FIG. 3 described above.

A collaborative display mark 92 following the board management document number 91 is also the same mark as the lead-free display marks 75 and 85 described above with reference to FIGS. 7 and 8. The collaborative display mark 92 suggests that the board management document number 91 in the first display means 90 relates to the lead-free display marks 75 and 85 in the second display means 70 and 80.

A read display mark 93 following the collaborative display mark 92 indicates, with a bar code, a content of the board management document number 91 or the lead-free display marks 75 and 85 described in the second display means 70 and 80. The bar code information is read with a bar code reader provided in a soldering facility and compared with setting information of a machine.

(2) Main Points and Features of Second Embodiment

As is apparent from the foregoing, the electronic board unit 10 according to the second embodiment of the present invention includes the printed circuit board 11 having the connector 12 mounted on one side thereof. The printed circuit board 11 includes, on the front surface or the back surface thereof, the front circuit components 13A or the back circuit components 13B, which are all soldered onto the printed circuit board 11 through lead-free solder having a low lead content rate.

The electronic board unit 10 includes the first display means 90 formed along at least one of opposite sides orthogonal to the one side of the printed circuit board 11, and the pair of the second display means 70 or the second display means 80 formed respectively along a left side and a right side that are the opposite sides orthogonal to the one side of the printed circuit board 11.

The first display means 90 serves as design information display means for displaying, with characters, the board management document number 91 that defines at least a material for the applied solder through use of a solder resist film applied to the front surface or the back surface of the printed circuit board 11.

The second display means 70 and 80 displays the lead-free display marks 75 and 85 that indicates at least that a lead content of the applied solder is less than a predetermined value through use of a solder resist film applied to the front surface or the back surface of the printed circuit board 11.

The lead-free display marks 75 and 85 are positioned close to a position at which the connector 12 is mounted and also serves as the operation information display means that includes the upper limit position display 72 and 82 and the lower limit position display 73 and 83, which indicate an appropriate amount level range of the coating liquid 61 for moisture prevention when the printed circuit board 11 is immersed in the hot-dipping bath 60 so that the coating liquid 61 for moisture prevention is applied to the printed circuit board 11.

The first display means 90 further includes, in addition to the board management document number 91, a bar code serving as the read display mark 93 that includes a content equivalent to the board management document number 91 or the lead-free display marks 75 and 85 described in the second display means 70 and 80.

As described above, according to claim 5 of the present invention, in the first display means, the read display mark that includes a content equivalent to the board management document number or the lead-free display mark described in the second display means is displayed with a bar code in addition to the board management document number.

Accordingly, the second embodiment has a feature in that the information on the printed circuit board is read with the bar code reader provided in the soldering facility and can be compared with the setting information of a machine.

What is claimed is:

1. An electronic board unit, comprising:
  a printed circuit board having a connector mounted on one side thereof, the printed circuit board including, on one of a front surface and a back surface thereof, one of front circuit components and back circuit components, which are all soldered onto the printed circuit board through lead-free solder having a low lead content rate;
  first display means formed along one of an opposite side parallel to the one side of the printed circuit board and at least one of opposite sides orthogonal to the one side of the printed circuit board; and
  a pair of second display means formed respectively along a left side and a right side that are the opposite sides orthogonal to the one side of the printed circuit board,
  the first display means serving as design information display means for displaying, with characters, a board management document number that defines at least a material for applied solder through use of a solder resist film applied to one of the front surface and the back surface of the printed circuit board, the pair of second display means displaying a lead-free display mark that indicates at least that a lead content of the applied solder is less than a predetermined value through use of a solder resist film applied to one of the front surface and the back surface of the printed circuit board, the lead-free display mark being positioned close to a position at which the connector is mounted and also serving as operation information display means that includes an upper limit position display and a lower limit position display, which indicate an appropriate amount level range of a coating liquid for moisture prevention when the printed circuit board is immersed in a hot-dipping bath so that the coating liquid for moisture prevention is applied to the printed circuit board.

2. An electronic board unit according to claim 1, wherein the board management document number, the lead-free display mark, the upper limit position display, and the lower limit position display are drawn on one of a surface of a base material for the printed circuit board and a surface of a copper foil bonded to the base material, which is exposed from an opening of the solder resist film applied so as to prevent adhesion of the solder to the surface of the copper foil on the printed circuit board, and wherein the coating liquid is transparent, and the solder resist film has a color tone different from a color tone of any one of the base material for the printed circuit board, the copper foil, and the solder.

3. An electronic board unit according to claim 1, wherein the first display means further comprises, in addition to the board management document number, a collaborative display mark that includes a content equivalent to the lead-free display mark described in the pair of second display means.

4. An electronic board unit according to claim 2, wherein the first display means further comprises, in addition to the board management document number, a collaborative display mark that includes a content equivalent to the lead-free display mark described in the pair of second display means.

5. An electronic board unit according to claim 1, wherein the first display means further comprises a trace number, wherein the trace number is a history information identification number typified by one of a manufacturing date of the electronic board unit and a manufacturing lot number of the electronic board unit, wherein, when an electronic board unit is manufactured with a new board management document number by changing at least a content of the board management document number described on the printed circuit board that has been stocked, the trace number serves as additional information for identifying the new board management document number, and wherein the trace number is drawn by one of stamping and laser processing.

6. An electronic board unit according to claim 2, wherein the first display means further comprises a trace number, wherein the trace number is a history information identification number typified by one of a manufacturing date of the electronic board unit and a manufacturing lot number of the electronic board unit, wherein, when an electronic board unit is manufactured with a new board management document number by changing at least a content of the board management document number described on the printed circuit board that has been stocked, the trace number serves as additional information for identifying the new board management document number, and wherein the trace number is drawn by one of stamping and laser processing.

7. An electronic board unit according to claim 3, wherein the first display means further comprises a trace number, wherein the trace number is a history information identification number typified by one of a manufacturing date of the electronic board unit and a manufacturing lot number of the electronic board unit, wherein, when an electronic board unit is manufactured with a new board management document number by changing at least a content of the board management document number described on the printed circuit board that has been stocked, the trace number serves as additional information for identifying the new board management document number, and wherein the trace number is drawn by one of stamping and laser processing.

8. An electronic board unit according to claim 4, wherein the first display means further comprises a trace number, wherein the trace number is a history information identification number typified by one of a manufacturing date of the electronic board unit and a manufacturing lot number of the electronic board unit, wherein, when an electronic board unit is manufactured with a new board management document number by changing at least a content of the board management document number described on the printed circuit board that has been stocked, the trace number serves as additional information for identifying the new board management document number, and wherein the trace number is drawn by one of stamping and laser processing.

9. An electronic board unit according to claim 3, wherein the first display means further comprises, in addition to the board management document number, a bar code serving as a read display mark that includes a content equivalent to one of the board management document number and the lead-free display mark described in the pair of second display means.

10. An electronic board unit according to claim 4, wherein the first display means further comprises, in addition to the board management document number, a bar code serving as a read display mark that includes a content equivalent to one of the board management document number and the lead-free display mark described in the pair of second display means.

11. An electronic board unit according to claim 5, wherein the first display means further comprises, in addition to the board management document number, a bar code serving as a read display mark that includes a content equivalent to one of the board management document number and the lead-free display mark described in the pair of second display means.

12. An electronic board unit according to claim 6, wherein the first display means further comprises, in addition to the board management document number, a bar code serving as a read display mark that includes a content equivalent to one of the board management document number and the lead-free display mark described in the pair of second display means.

13. An electronic board unit according to claim 7, wherein the first display means further comprises, in addition to the board management document number, a bar code serving as a read display mark that includes a content equivalent to one of the board management document number and the lead-free display mark described in the pair of second display means.

14. An electronic board unit according to claim 8, wherein the first display means further comprises, in addition to the board management document number, a bar code serving as a read display mark that includes a content equivalent to one of the board management document number and the lead-free display mark described in the pair of second display means.

15. An electronic board unit according to claim 3, wherein, in a case where the printed circuit board is subjected to soldering on both surfaces of the printed circuit board, the first display means is formed on both surfaces of the printed circuit board as a first display means front part and a first display means back part or formed on at least one of the front surface and the back surface, and the pair of second display means is formed on both the surfaces as a second display means front part and a second display means back part or formed on at least another of the front surface and the back surface.

16. An electronic board unit according to claim 4, wherein, in a case where the printed circuit board is subjected to soldering on both surfaces of the printed circuit board, the first display means is formed on both surfaces of the printed circuit board as a first display means front part and a first display means back part or formed on at least one of the front surface and the back surface, and the pair of second display means is formed on both the surfaces as a second display means front part and a second display means back part or formed on at least another of the front surface and the back surface.

* * * * *